(12) United States Patent
Sheen et al.

(10) Patent No.: US 9,748,241 B2
(45) Date of Patent: Aug. 29, 2017

(54) SEMICONDUCTOR DEVICE FOR SIMULTANEOUS OPERATION AT TWO TEMPERATURE RANGES

(71) Applicant: Taiwan Semiconductor Manufacturing Company Limited, Hsinchu (TW)

(72) Inventors: Ruey-Bin Sheen, Taichung (TW); Chao-Chieh Li, Hsinchu (TW); Ying-Yu Hsu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 23 days.

(21) Appl. No.: 14/632,013

(22) Filed: Feb. 26, 2015

(65) Prior Publication Data

US 2016/0254260 A1    Sep. 1, 2016

(51) Int. Cl.
| | |
|---|---|
| *H01L 27/088* | (2006.01) |
| *H01L 27/092* | (2006.01) |
| *H01L 29/423* | (2006.01) |
| *H01L 27/02* | (2006.01) |
| *H01L 23/367* | (2006.01) |
| *H01L 29/78* | (2006.01) |
| *H03K 3/03* | (2006.01) |

(52) U.S. Cl.
CPC ........ *H01L 27/0922* (2013.01); *H01L 23/367* (2013.01); *H01L 27/0207* (2013.01); *H01L 27/0211* (2013.01); *H01L 27/092* (2013.01); *H01L 27/0924* (2013.01); *H01L 29/4232* (2013.01); *H01L 29/785* (2013.01); *H01L 23/3677* (2013.01); *H03K 3/0315* (2013.01)

(58) Field of Classification Search
None
See application file for complete search history.

(56) References Cited

U.S. PATENT DOCUMENTS

| 8,169,025 B2* | 5/2012 | Bedell | H01L 21/845 257/351 |
|---|---|---|---|
| 2011/0147848 A1* | 6/2011 | Kuhn | H01L 21/76229 257/368 |
| 2014/0065802 A1* | 3/2014 | Chang | H01L 21/845 438/479 |
| 2015/0311085 A1* | 10/2015 | Kozarsky | H01L 21/3086 257/401 |

* cited by examiner

*Primary Examiner* — Ali Naraghi
(74) *Attorney, Agent, or Firm* — Jones Day

(57) ABSTRACT

A semiconductor device for simultaneous operation at two temperature ranges includes a substrate, a first transistor, and a second transistor. The substrate has a first active region and a second active region. The first transistor includes a plurality of gate stacks disposed in the first active region. The second transistor includes a plurality of gate stacks disposed in the second active region. A ratio of the number of the gate stacks of the second transistor to an area size of the second active region is less than a ratio of the number of the gate stacks of the first transistor to an area size of the first active region.

20 Claims, 8 Drawing Sheets

SEMICONDUCTOR DEVICE FOR SIMULTANEOUS OPERATION AT TWO TEMPERATURE RANGES

BACKGROUND

A planar field-effect transistor (FET) includes a substrate, a source region, a drain region, and a channel between the source and drain regions. The channel is disposed in the substrate. During operation, heat generated in the channel of the planar FET may dissipate through the substrate.

A vertical gate-all-around FET (VGAA FET) includes a substrate, a first source/drain (S/D) region that is disposed on the substrate, a second S/D region that is disposed above the first S/D region, a nanowire that is between the first and second S/D regions, and a gate stack that surrounds the nanowire. During operation, since the nanowire of the VGAA FET is disposed outside of the substrate, heat may not easily dissipate from the nanowire of the VGAA FET.

A FinFET includes a substrate, a fin, and a gate stack. The fin extends from the substrate, and includes a source region, a drain region, and a channel that is between the source and drain regions and that underlies the gate stack. During operation, since the fin of the FinFET is disposed outside of the substrate, heat may not easily dissipate from the fin of the FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
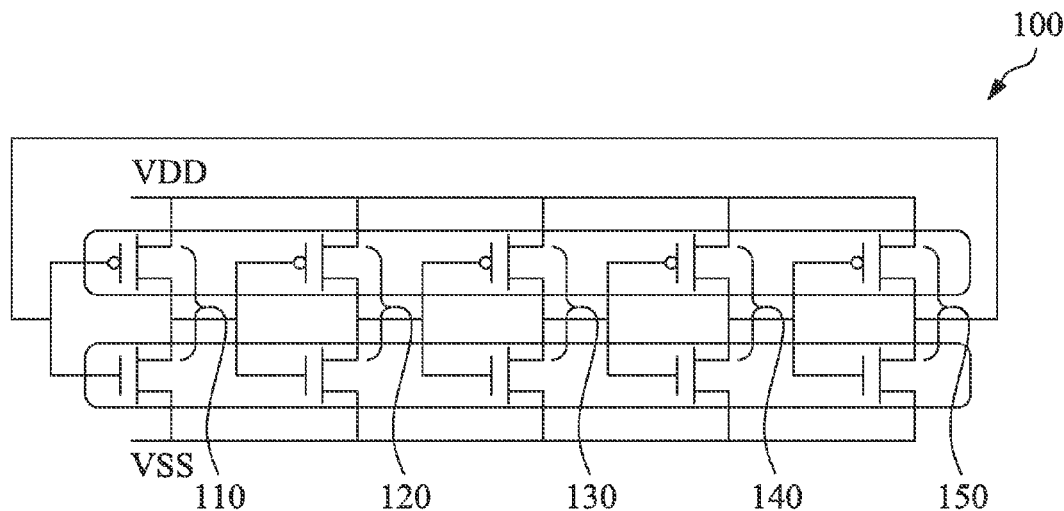
FIG. 1 is a schematic circuit diagram of an exemplary 5-stage ring voltage controlled oscillator (VCO) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device that, in an exemplary embodiment, is a ring voltage controlled oscillator (VCO). A VCO generates an output signal, a frequency of which is controlled by an input voltage.

FIG. 1 is a schematic circuit diagram of an exemplary 5-stage ring VCO in accordance with some embodiments. As illustrated in FIG. 1, the VCO 100 includes five inverters 110, 120, 130, 140, 150 that are connected in series to form a loop, whereby an output of the last inverter 150 is fed back to an input of the first inverter 110. Each of the inverters 110, 120, 130, 140, 150 includes a pair of transistors, each of which is a field-effect transistor (FET), one of which is a p-type FET, and the other of which is an n-type FET.

Analysis of the ring VCO 100 shows that when the transistors thereof having a first conductive type, e.g., the p-type FETs thereof, are operated at a high temperature, e.g., 150 degrees Celsius, and when the other transistors thereof having a second conductivity type, e.g., the n-type FETs thereof, are operated at a low temperature, e.g., 27 degrees Celsius, a relatively low phase noise is obtained for the ring VCO 100. This is validated by experimental results. As will be described herein, the semiconductor device of the present disclosure includes a pair of transistors, one of which is configured to operate at a low temperature range and the other of which is configured to operate at a high temperature range.

Figure 2:
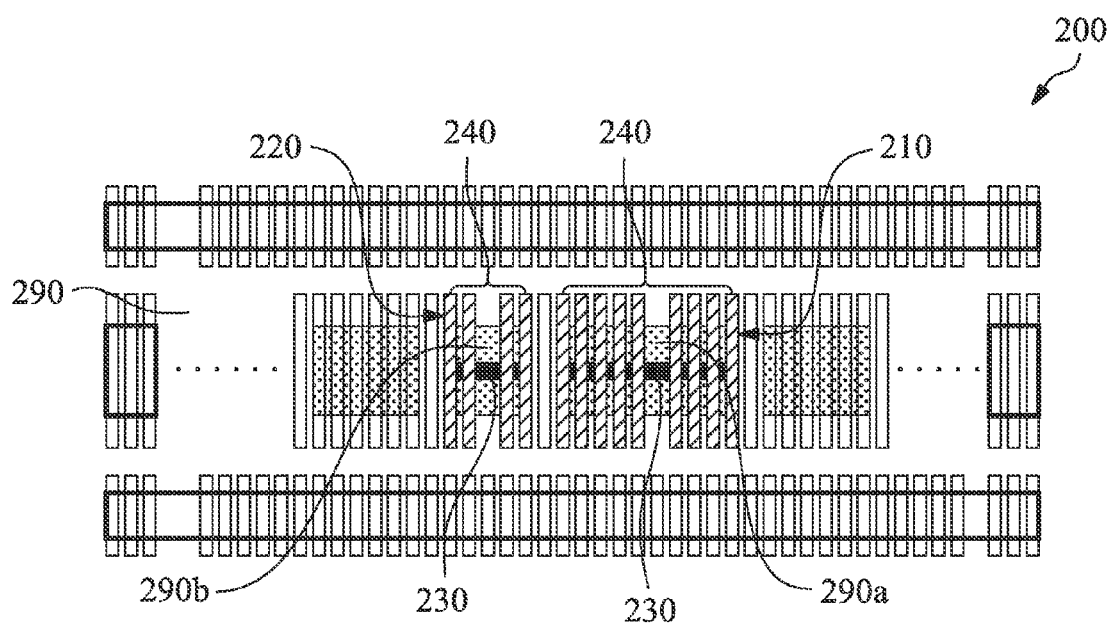
FIG. 2 is a schematic sectional top view of the first exemplary semiconductor device in accordance with some embodiments.

FIG. 2 is a schematic sectional top view of the first exemplary semiconductor device in accordance with some embodiments. As illustrated in FIG. 2, the semiconductor device 200 includes a substrate 290, a first transistor 210, and a second transistor 220.

The substrate 290 includes a first active region 290a and a second active region 290b. In this exemplary embodiment, the second active region 290b has an area size smaller than an area size of the first active region 290a. Each of the first and second transistors 210, 220 includes a plurality of fins 230 (only one of the fins 230 of each of the first and second transistors 210, 220 is shown in FIG. 2) and a plurality of gate stacks 240. The fin 230 of each of the first and second transistors 210, 220 extends from a respective one of the first and second active regions 290a, 290b. The gate stacks 240 extend generally transverse to the fin 230 and are arranged along the length of the fin 230. The fin 230 includes a plurality of source regions, a plurality of drain regions, and a plurality of channels, each of which is between a respective one of the source regions and a respective one of the drain regions and each of which is overlaid by a respective one of the gate stacks 240.

The semiconductor device 200 further includes an isolation region (not shown), such as a shallow trench isolation (STI) region, that is disposed on the substrate 290, that underlies the gate stacks 240, and that surrounds the fins 230.

In this exemplary embodiment, the number of the gate stacks 240 of the second transistor 220 is less than the number of the gate stacks 240 of the first transistor 210 and the gate stacks 240 of the second transistor 220 have a pitch substantially equal to a pitch of the gate stacks 240 of the first transistor 210. In another exemplary embodiment, the gate stacks 240 of the second transistor 220 have a pitch greater than a pitch of the gate stacks 240 of the first transistor 210.

Figure 3:
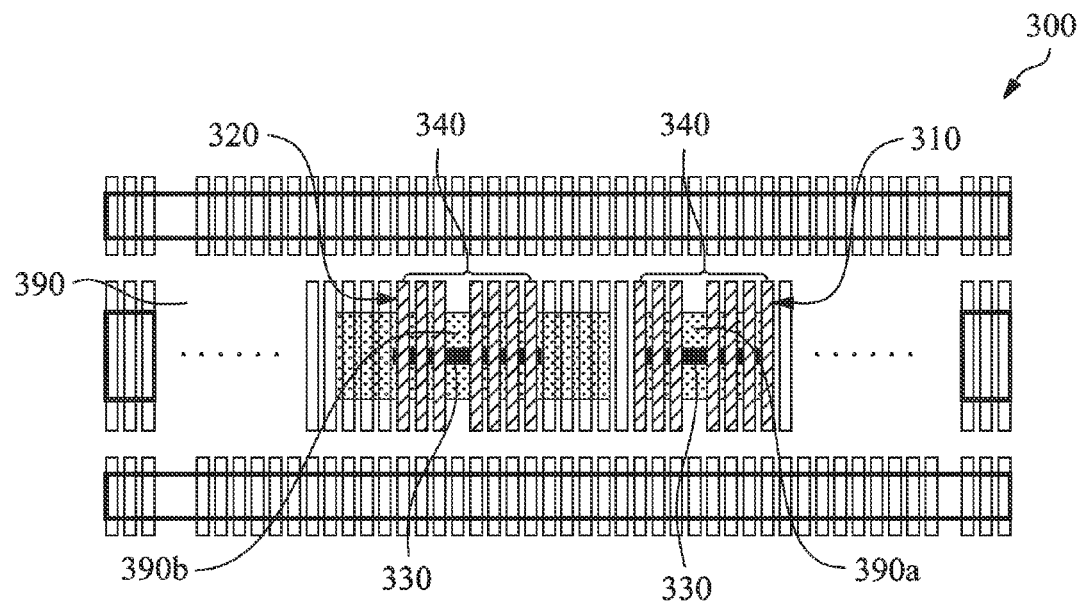
FIG. 3 is a schematic sectional top view of the second exemplary semiconductor device in accordance with some embodiments.

FIG. 3 is a schematic sectional top view of the second exemplary semiconductor device in accordance with some embodiments. As illustrated in FIG. 3, the semiconductor device 300 includes a substrate 390, a first transistor 310, and a second transistor 320.

The substrate 390 includes a first active region 390a and a second active region 390b. In this exemplary embodiment, the second active region 390b has an area size larger than an area size of the first active region 390a. Each of the first and second transistors 310, 320 includes a plurality of fins 330 (only one of the fins 330 of each of the first and second transistors 310, 320 is shown in FIG. 3) and a plurality of gate stacks 340. The fin 330 of each of the first and second transistors 310, 320 extends from a respective one of the first and second active regions 390a, 390b. The gate stacks 340 extend generally transverse to the fin 330 and are arranged along the length of the fin 330. The fin 330 includes a plurality of source regions, a plurality of drain regions, and a plurality of channels, each of which is between a respective one of the source regions and a respective one of the drain regions and each of which is overlaid by a respective one of the gate stacks 340.

The semiconductor device 300 further includes an isolation region (not shown), such as an STI region, that is disposed on the substrate 390, that underlies the gate stacks 340, and that surrounds the fins 330.

In this exemplary embodiment, the number of the gate stacks 340 of the second transistor 320 is equal to the number of the gate stacks 340 of the first transistor 310 and the gate stacks 340 of the second transistor 320 have a pitch substantially equal to a pitch of the gate stacks 340 of the first transistor 310. In another exemplary embodiment, the number of the gate stacks 340 of the second transistor 320 is less than the number of the gate stacks 340 of the first transistor 310. In another exemplary embodiment, the gate stacks 340 of the second transistor 320 have a pitch greater than a pitch of the gate stacks 340 of the first transistor 310.

Figure 4:
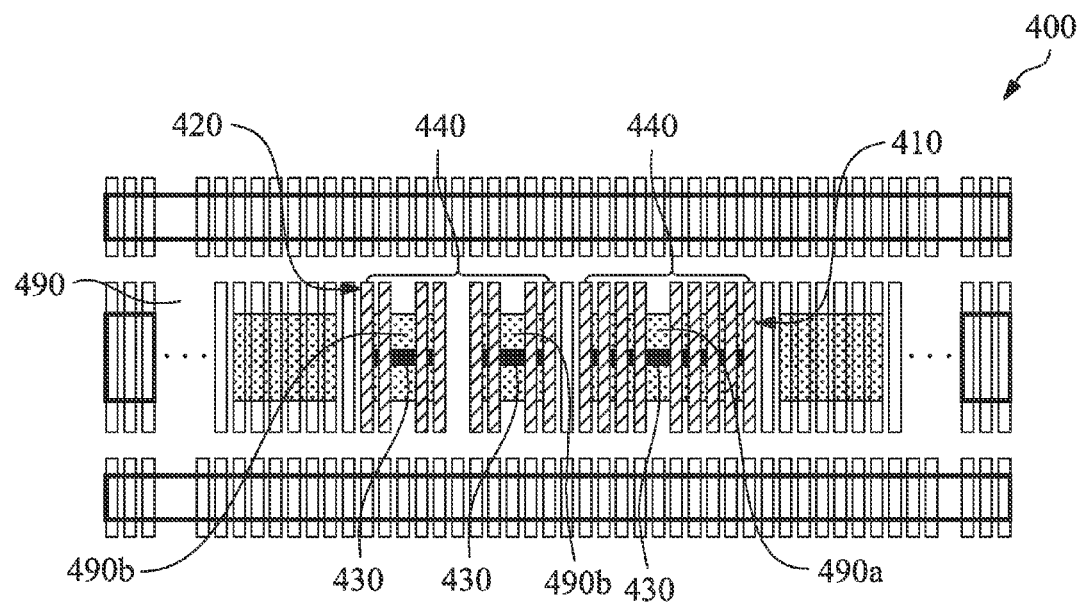
FIG. 4 is a schematic sectional top view of the third exemplary semiconductor device in accordance with some embodiments.

FIG. 4 is a schematic sectional top view of the third exemplary semiconductor device in accordance with some embodiments. As illustrated in FIG. 4, the semiconductor device 400 includes a substrate 490, a first transistor 410, and a second transistor 420.

The substrate 490 includes a first active region 490a and a pair of second active regions 490b. In this exemplary embodiment, each of the second active regions 490b has an area size smaller than an area size of the first active region 490a and the second active regions 490b have substantially the same area size. In another exemplary embodiment, the second active regions 490b have different area sizes. Each of the first and second transistors 410, 420 includes a plurality of fins 430 (only one of the fins 430 of the first transistor 410 and a pair of the fins 430 of the second transistor 420 are shown in FIG. 4) and a plurality of gate stacks 440. The fin 430 of the first transistor 410 extends from the first active region 490a. Each of the fins 430 of the second transistor 420 extends from a respective one of the second active regions 490b. The gate stacks 440 extend generally transverse to the fin 430 and are arranged along the length of the fin 430. The fin 430 includes a plurality of source regions, a plurality of drain regions, and a plurality of channels, each of which is between a respective one of the source regions and a respective one of the drain regions and each of which is overlaid by a respective one of the gate stacks 440.

The semiconductor device 400 further includes an isolation region (not shown), such as an STI region, that is disposed on the substrate 490, that underlies the gate stacks 440, and that surrounds the fins 430.

In this exemplary embodiment, the number of the gate stacks 440 of the second transistor 420 is equal to the number of the gate stacks 440 of the first transistor 410, the number of the gate stacks 440 in one of the second active regions 490b is equal to the number of the gate stacks 440 in the other of the second active regions 490b, and the gate stacks 440 in at least one of the second active regions 490b have a pitch substantially equal to a pitch of the gate stacks 440 in the first active region 490a. In another exemplary embodiment, the number of the gate stacks 440 of the second transistor 420 is less than the number of the gate stacks 440 of the first transistor 410. In another exemplary embodiment, the number of the gate stacks 440 in one of the second active regions 490b is different from the number of the gate stacks 440 in the other of the second active regions 490b. In another exemplary embodiment, the gate stacks 440 in at least one of the second active regions 490b have a pitch greater than a pitch of the gate stacks 440 in the first active region 490a.

It is noted that, although the substrate 490 is exemplified as including only a pair of second active regions, it should be understood that the number of second active regions may be increased as required.

Figure 5:
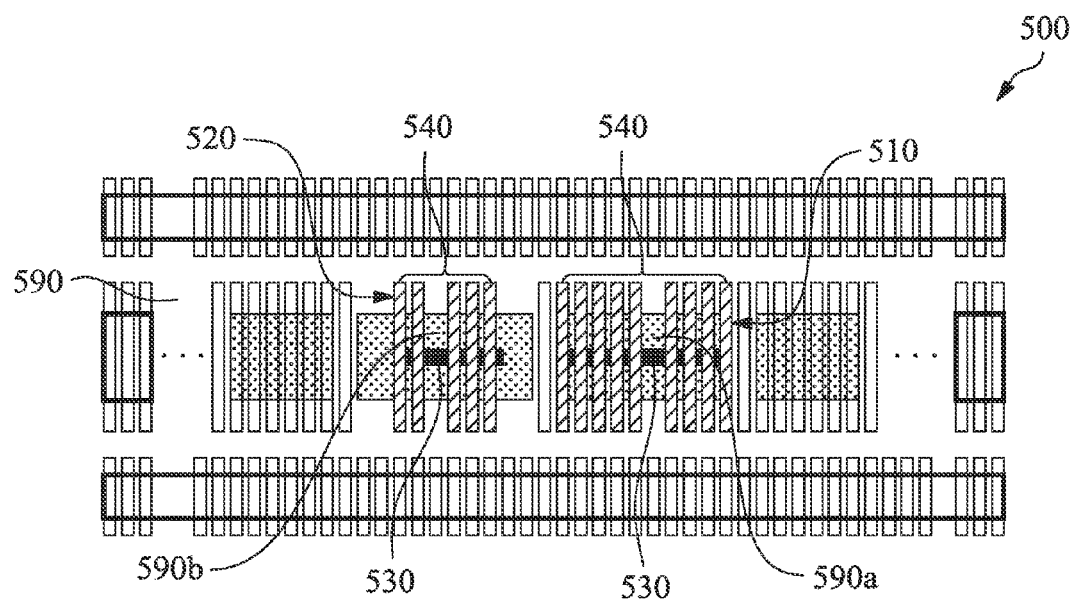
FIG. 5 is a schematic sectional top view of the fourth exemplary semiconductor device in accordance with some embodiments.

FIG. 5 is a schematic sectional top view of the fourth exemplary semiconductor device in accordance with some embodiments. As illustrated in FIG. 5, the semiconductor device 500 includes a substrate 590, a first transistor 510, and a second transistor 520.

The substrate 590 includes a first active region 590a and a second active region 590b. In this exemplary embodiment, the second active region 590b has an area size substantially equal to an area size of the first active region 590a. Each of the first and second transistors 510, 520 includes a plurality of fins 530 (only one of the fins 530 of each of the first and second transistors 510, 520 is shown in FIG. 5) and a plurality of gate stacks 540. The fin 530 of each of the first and second transistors 510, 520 extends from a respective one of the first and second active regions 590a, 590b. The gate stacks 540 extend generally transverse to the fin 530 and are arranged along the length of the fin 530. The fin 530 includes a plurality of source regions, a plurality of drain regions, and a plurality of channels, each of which is between a respective one of the source regions and a respective one of the drain regions and each of which is overlaid by a respective one of the gate stacks 540.

The semiconductor device 500 further includes an isolation region (not shown), such as an STI region, that is disposed on the substrate 590, that underlies the gate stacks 540, and that surrounds the fins 530.

In this exemplary embodiment, the number of the gate stacks 540 of the second transistor 520 is less than the number of the gate stacks 540 of the first transistor 510 and the gate stacks 540 of the second transistor 520 have a pitch substantially equal to a pitch of the gate stacks 540 of the first transistor 510. In another exemplary embodiment, the gate stacks 540 of the second transistor 520 have a pitch greater than a pitch of the gate stacks 540 of the first transistor 510.

Figure 6:
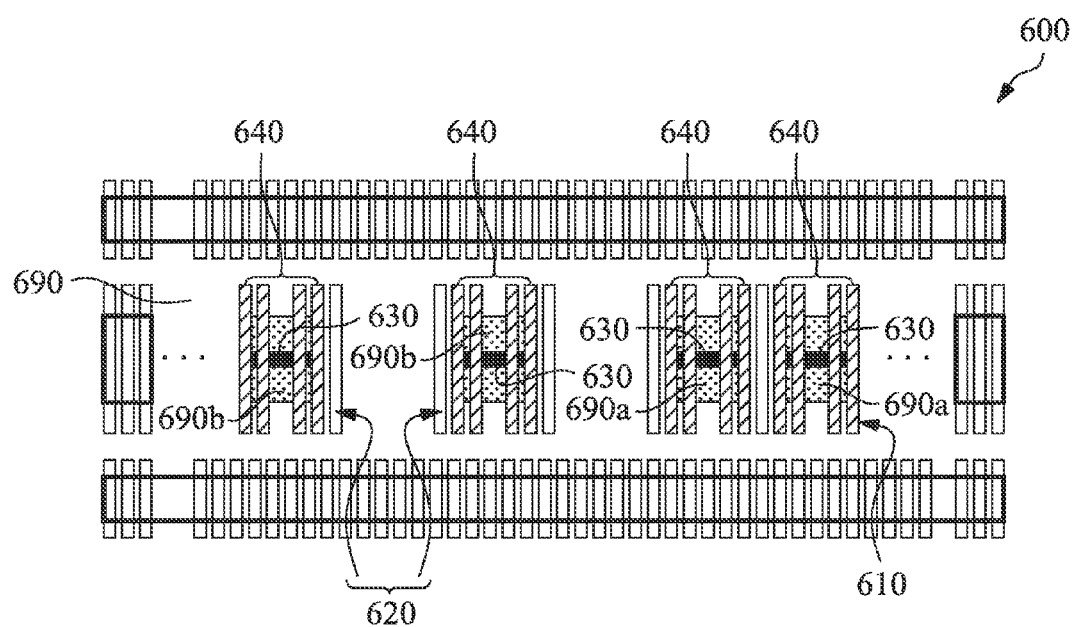
FIG. 6 is a schematic sectional top view of the fifth exemplary semiconductor device in accordance with some embodiments.

FIG. 6 is a schematic sectional top view of the fifth exemplary semiconductor device in accordance with some embodiments. As illustrated in FIG. 6, the semiconductor device 600 includes a substrate 690, a first transistor 610, and a second transistor 620.

The substrate 690 includes a plurality of first active regions 690a and a plurality of second active regions 690b. In this exemplary embodiment, an adjacent pair of the second active regions 690b define a distance therebetween greater than a distance between an adjacent pair of the first active regions 690a. Each of the first and second transistors 610, 620 includes a plurality of fins 630 (only a pair of the fins 630 of each of the first and second transistors 610, 620 are shown in FIG. 6) and a plurality of gate stacks 640. Each of the fins 630 of the first transistor 610 extends from a respective one of the first active regions 690a. Each of the fins 630 of the second transistor 620 extends from a respective one of the second active regions 690b. The gate stacks 640 extend generally transverse to the fin 630 and are arranged along the length of the fin 630. The fin 630 includes a plurality of source regions, a plurality of drain regions, and a plurality of channels, each of which is between a respective one of the source regions and a respective one of the drain regions and each of which is overlaid by a respective one of the gate stacks 640.

The semiconductor device 600 further includes an isolation region (not shown), such as an STI region, that is disposed on the substrate 690, that underlies the gate stacks 640, and that surrounds the fins 630.

Figure 7:
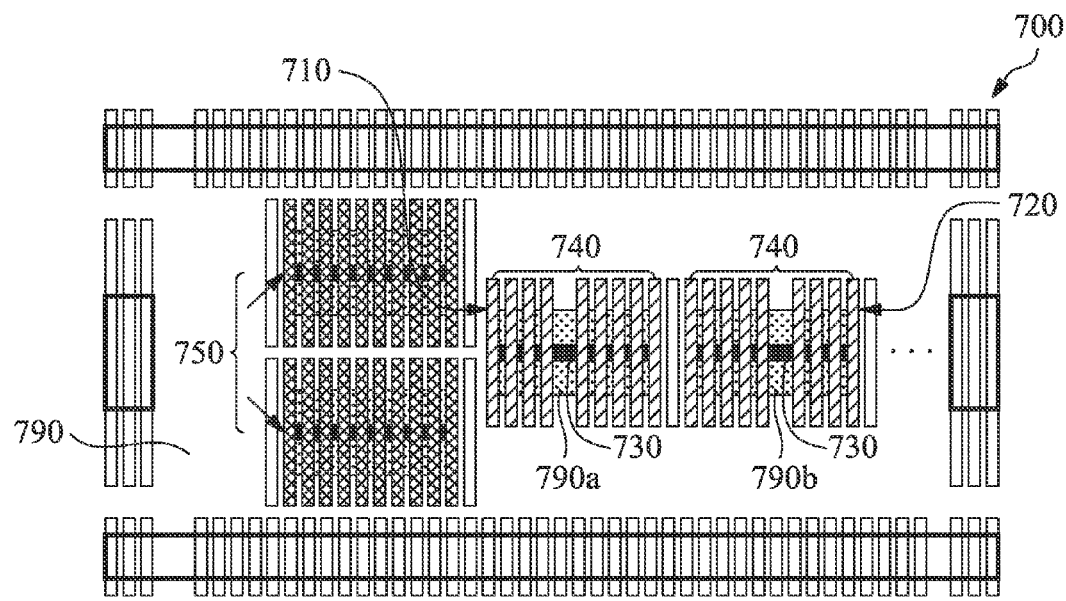
FIG. 7 is a schematic sectional top view of the sixth exemplary semiconductor device in accordance with some embodiments.

FIG. 7 is a schematic sectional top view of the sixth exemplary semiconductor device in accordance with some embodiments. As illustrated in FIG. 7, the semiconductor device 700 includes a substrate 790, a first transistor 710, a second transistor 720, and another semiconductor device 750. In an exemplary embodiment, the semiconductor device 700 is a 2.5- or 3-dimensional integrated circuit (IC). In another exemplary embodiment, the semiconductor device 700 is a stack complementary MOS (CMOS).

In this exemplary embodiment, the first and second transistors 710, 720 are respectively disposed proximate to and distal from the semiconductor device 750. The semiconductor device 750, in an exemplary embodiment, includes a plurality of transistors.

The substrate 790 includes a first active region 790a and a second active region 790b. Each of the first and second transistors 710, 720 includes a plurality of fins 730 (only one of the fins 730 of each of the first and second transistors 710, 720 is shown in FIG. 7) and a plurality of gate stacks 740. The fin 730 of each of the first and second transistors 710, 720 extends from a respective one of the first and second active regions 790a, 790b. The gate stacks 740 extend generally transverse to the fin 730 and are arranged along the length of the fin 730. The fin 730 includes a plurality of source regions, a plurality of drain regions, and a plurality of channels, each of which is between a respective one of the source regions and a respective one of the drain regions and each of which is overlaid by a respective one of the gate stacks 740.

The semiconductor device 700 further includes an isolation region (not shown), such as an STI region, that is disposed on the substrate 790, that underlies the gate stacks 740, and that surrounds the fins 730.

Figure 8:
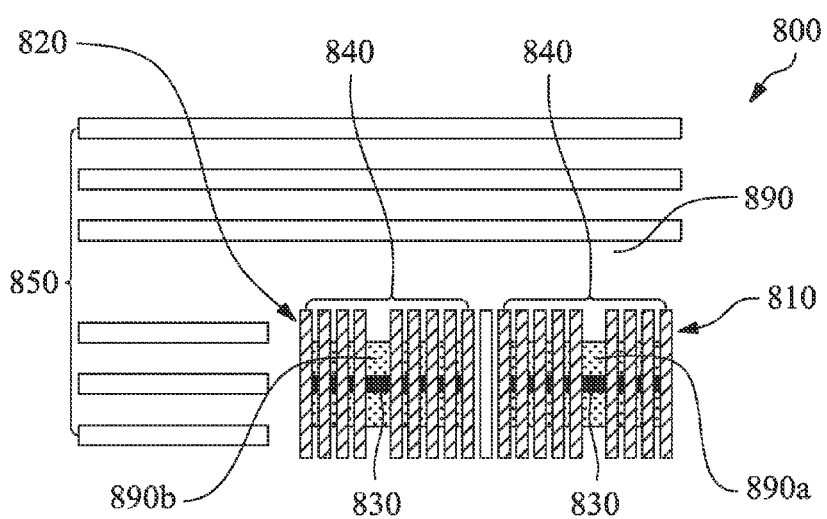
FIG. 8 is a schematic sectional top view of the seventh exemplary semiconductor device in accordance with some embodiments.

FIG. 8 is a schematic sectional top view of the seventh exemplary semiconductor device in accordance with some embodiments. As illustrated in FIG. 8, the semiconductor device 800 includes a substrate 890, a first transistor 810, a second transistor 820, and a semiconductor heat sink 850.

The substrate 890 includes a first active region 890a and a second active region 890b. Each of the first and second transistors 810, 820 includes a plurality of fins 830 (only one of the fins 830 of each of the first and second transistors 810, 820 is shown in FIG. 8) and a plurality of gate stacks 840. The fin 830 of each of the first and second transistors 810, 820 extends from a respective one of the first and second active regions 890a, 890b. The gate stacks 840 extend generally transverse to the fin 830 and are arranged along the length of the fin 830. The fin 830 includes a plurality of source regions, a plurality of drain regions, and a plurality of channels, each of which is between a respective one of the source regions and a respective one of the drain regions and each of which is overlaid by a respective one of the gate stacks 840.

The semiconductor device 800 further includes an isolation region (not shown), such as an STI region, that is disposed on the substrate 890, that underlies the gate stacks 840, and that surrounds the fins 830.

In this exemplary embodiment, the semiconductor heat sink 850 includes a dummy metal layer, e.g., metal layer MO, disposed above the first and second transistors 810, 820, connected to the gate stacks 840 of the second transistor 820, and free from connection with the first transistor 810.

In an alternative exemplary embodiment, the semiconductor heat sink 850 further includes one or more dummy metal layers, e.g., metal layers M1-M11, disposed one above the other on the dummy metal layer.

Figure 9:
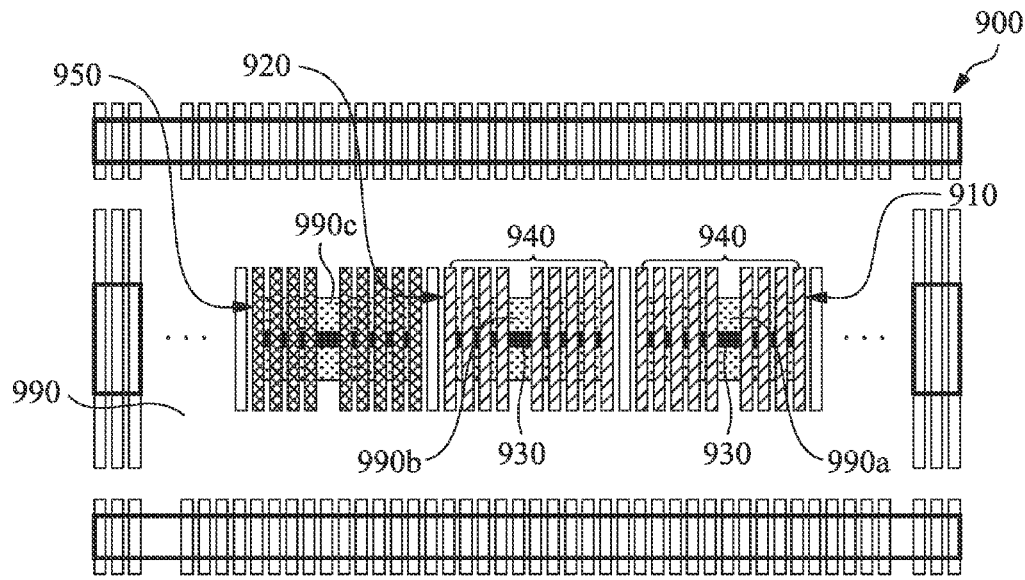
FIG. 9 is a schematic sectional top view of the eighth exemplary semiconductor device in accordance with some embodiments.

FIG. 9 is a schematic sectional top view of the eighth exemplary semiconductor device in accordance with some embodiments. As illustrated in FIG. 9, the semiconductor device 900 includes a substrate 990, a first transistor 910, a second transistor 920, and a semiconductor heat sink 950.

The substrate 990 includes a first active region 990a, a second active region 990b, and at least one dummy active region 990c. Each of the first and second transistors 910, 920 includes a plurality of fins 930 (only one of the fins 930 of each of the first and second transistors 910, 920 is shown in FIG. 9) and a plurality of gate stacks 940. The fin 930 of each of the first and second transistors 910, 920 extends from a respective one of the first and second active regions 990a, 990b. The gate stacks 940 extend generally transverse to the fin 930 and are arranged along the length of the fin 930. The fin 930 includes a plurality of source regions, a plurality of drain regions, and a plurality of channels, each of which is between a respective one of the source regions and a respective one of the drain regions and each of which is overlaid by a respective one of the gate stacks 940.

The semiconductor heat sink 950 includes at least one dummy transistor disposed in the at least one dummy active region 990c, connected to the gate stacks 940 of the second transistor 920, and free from connection with the first transistor 910. In this exemplary embodiment, the at least one dummy transistor is a FinFET. In another exemplary embodiment, the at least one dummy transistor is a planar FET or a VGAA FET.

The semiconductor device 900 further includes an isolation region (not shown), such as an STI region, that is disposed on the substrate 990, that underlies gate stacks of the at least one dummy transistor and the gate stacks 940, and that surrounds fins of the at least one dummy transistor and the fins 930.

Figure 10:
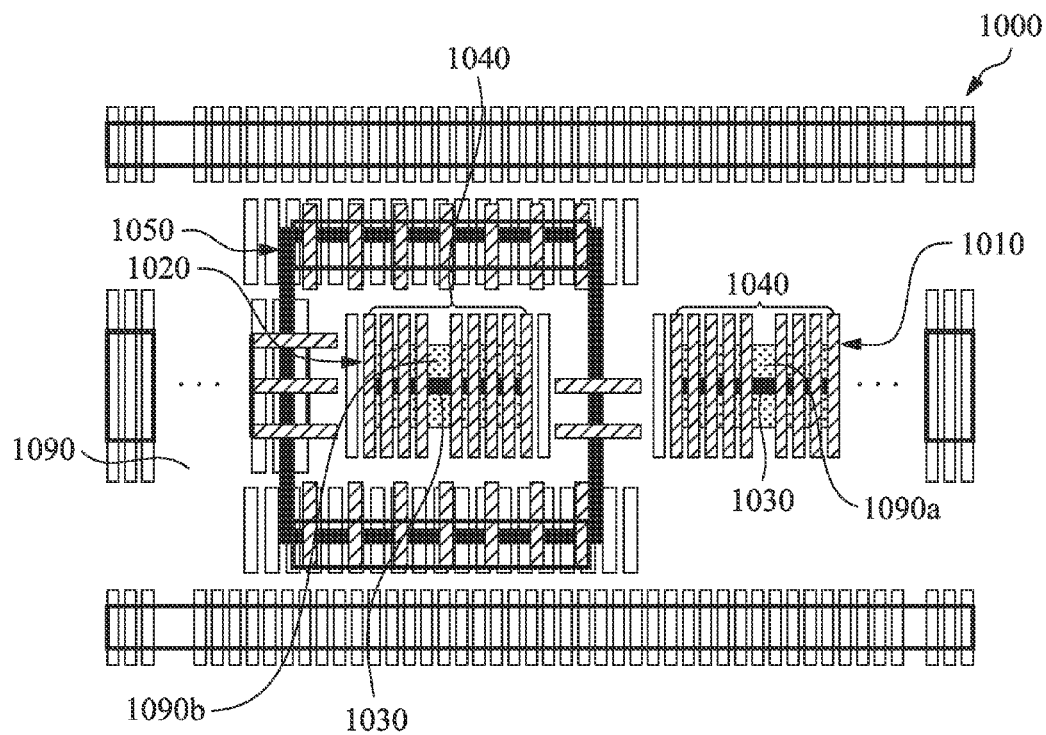
FIG. 10 is a schematic sectional top view of the ninth exemplary semiconductor device in accordance with some embodiments.

FIG. 10 is a schematic sectional top view of the ninth exemplary semiconductor device in accordance with some embodiments. As illustrated in FIG. 10, the semiconductor device 1000 includes a substrate 1090, a first transistor 1010, a second transistor 1020, and a semiconductor heat sink 1050.

The substrate 1090 includes a first active region 1090a and a second active region 1090b. Each of the first and second transistors 1010, 1020 includes a plurality of fins 1030 (only one of the fins 1030 of each of the first and second transistors 1010, 1020 is shown in FIG. 10) and a plurality of gate stacks 1040. The fin 1030 of each of the first and second transistors 1010, 1020 extends from a respective one of the first and second active regions 1090a, 1090b. The gate stacks 1040 extend generally transverse to the fin 1030 and are arranged along the length of the fin 1030. The fin 1030 includes a plurality of source regions, a plurality of drain regions, and a plurality of channels, each of which is between a respective one of the source regions and a respective one of the drain regions and each of which is overlaid by a respective one of the gate stacks 1040.

In this exemplary embodiment, the semiconductor heat sink 1050 includes at least one dummy guard ring that is connected to the gate stacks 1040 of the second transistor 1020, that is free from connection with the first transistor 1010, and that includes a fin and a plurality of gate stacks. The fin of the at least one dummy guard ring extends from the substrate 1090 and is disposed around the second transistor 1020. The gate stacks of the at least one dummy guard ring are arranged along the length of the fin of the at least one dummy guard ring.

The semiconductor device 1000 further includes an isolation region (not shown), such as an STI region, that is disposed on the substrate 1090, that underlies the gate stacks of the at least one dummy guard ring and the gate stacks 1040, and that surrounds the fin of the at least one dummy guard ring and the fins 1030.

Figure 11:
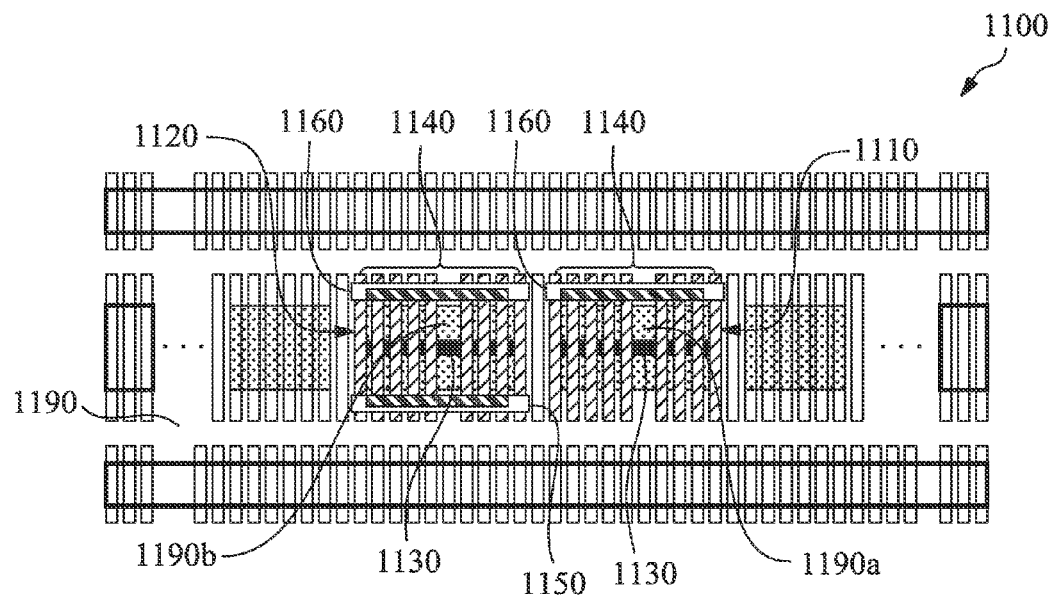
FIG. 11 is a schematic sectional top view of the tenth exemplary semiconductor device in accordance with some embodiments.

FIG. 11 is a schematic sectional top view of the tenth exemplary semiconductor device in accordance with some embodiments. As illustrated in FIG. 11, the semiconductor device 1100 includes a substrate 1190, a first transistor 1110, a second transistor 1120, and a semiconductor heat sink 1150.

The substrate 1190 includes a first active region 1190a and a second active region 1190b. Each of the first and second transistors 1110, 1120 includes a plurality of fins 1130 (only one of the fins 1130 of each of the first and second transistors 1110, 1120 is shown in FIG. 11), a plurality of gate stacks 1140, and a gate contact 1160. The fin 1130 of each of the first and second transistors 1110, 1120 extends from a respective one of the first and second active regions 1190a, 1190b. The gate stacks 1140 extend generally transverse to the fin 1130 and are arranged along the length of the fin 1130. The fin 1130 includes a plurality of source regions, a plurality of drain regions, and a plurality of channels, each of which is between a respective one of the source regions and a respective one of the drain regions and each of which is overlaid by a respective one of the gate stacks 1140.

The semiconductor device 1100 further includes an isolation region (not shown), such as an STI region, that is disposed on the substrate 1190, that underlies the gate stacks 1140, and that surrounds the fins 1130.

The gate contact 1160 of each of the first and second transistors 1110, 1120 is provided on the gate stacks 1140 of a respective one of the first and second transistors 1110, 1120.

The semiconductor heat sink 1150 includes at least one gate contact that is provided on the gate stacks 1140 of the second transistor 1120 and that serves as another gate contact of the second transistor 1120.

Figure 12:
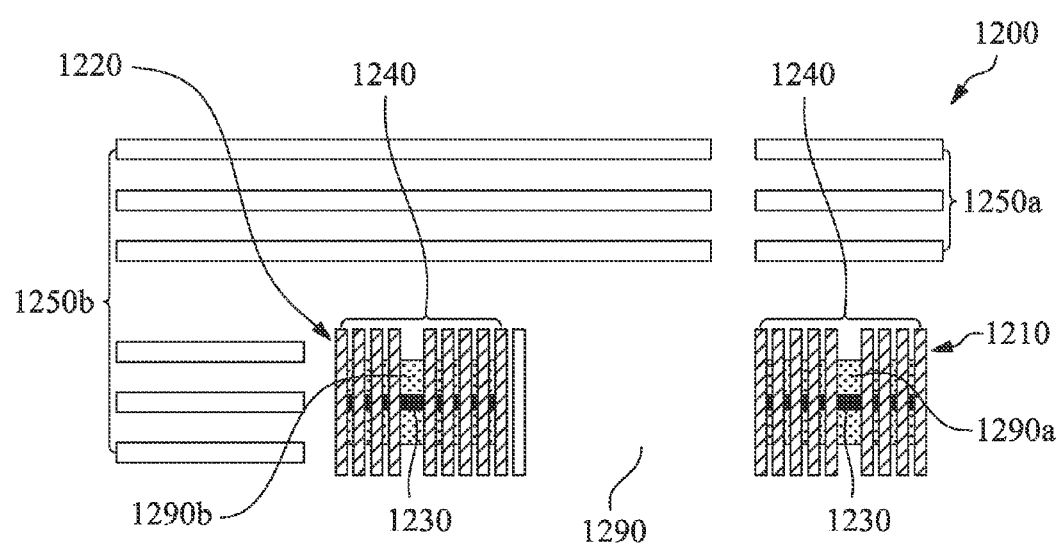
FIG. 12 is a schematic sectional top view of the eleventh exemplary semiconductor device in accordance with some embodiments.

FIG. 12 is a schematic sectional top view of the eleventh exemplary semiconductor device in accordance with some embodiments. As illustrated in FIG. 12, the semiconductor device 1200 includes a substrate 1290, a first transistor 1210, a second transistor 1220, a first semiconductor heat sink 1250a, and a second semiconductor heat sink 1250b.

The substrate 1290 includes a first active region 1290a and a second active region 1290b. Each of the first and second transistors 1210, 1220 includes a plurality of fins 1230 (only one of the fins 1230 of each of the first and second transistors 1210, 1220 is shown in FIG. 12) and a plurality of gate stacks 1240. The fin 1230 of each of the first and second transistors 1210, 1220 extends from a respective one of the first and second active regions 1290a, 1290b. The gate stacks 1240 extend generally transverse to the fin 1230 and are arranged along the length of the fin 1230. The fin 1230 includes a plurality of source regions, a plurality of drain regions, and a plurality of channels, each of which is between a respective one of the source regions and a respective one of the drain regions and each of which is overlaid by a respective one of the gate stacks 1240.

The semiconductor device 1200 further includes an isolation region (not shown), such as an STI region, that is disposed on the substrate 1290, that underlies the gate stacks 1240, and that surrounds the fins 1230.

The first semiconductor heat sink 1250a includes at least one dummy metal layer disposed above the first and second transistors 1210, 1220, connected to the gate stacks 1240 of the first transistor 1210, and free from connection with the second transistor 1220. The second semiconductor heat sink 1250b includes a plurality of dummy metal layers disposed above the first and second transistors 1210, 1220, connected to the gate stacks 1240 of the second transistor 1220, and free from connection with the first transistor 1210. In this exemplary embodiment, the number of the dummy metal layers of the second semiconductor heat sink 1250b is greater than the number of the at least one dummy metal layer of the first semiconductor heat sink 1250a.

Figure 13:
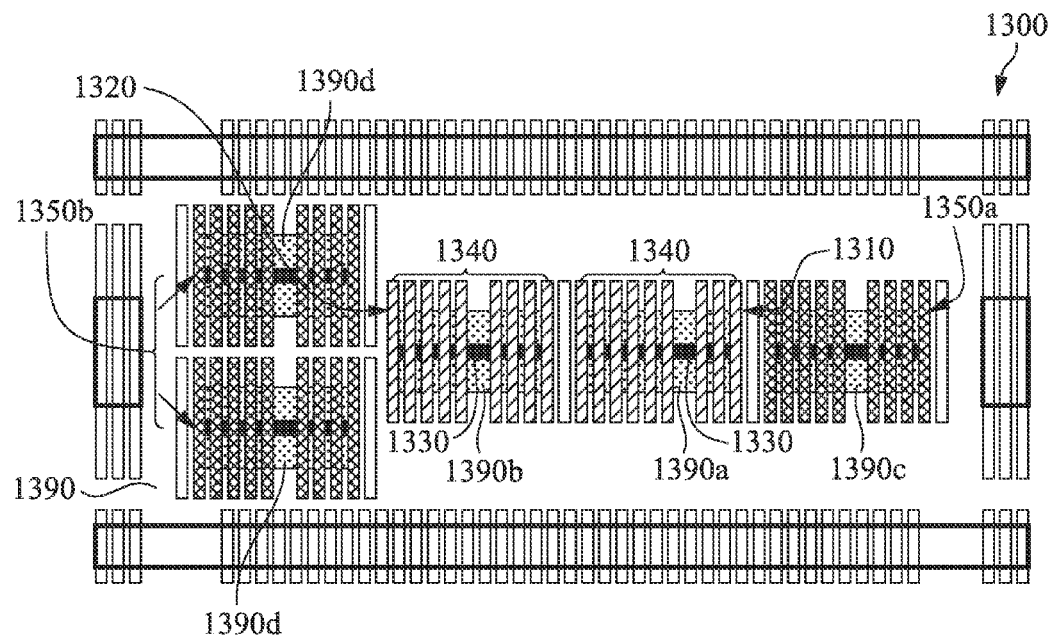
FIG. 13 is a schematic sectional top view of the twelfth exemplary semiconductor device in accordance with some embodiments.

FIG. 13 is a schematic sectional top view of the twelfth exemplary semiconductor device in accordance with some embodiments. As illustrated in FIG. 13, the semiconductor device 1300 includes a substrate 1390, a first transistor 1310, a second transistor 1320, a first semiconductor heat sink 1350a, and a second semiconductor heat sink 1350b.

The substrate 1390 includes a first active region 1390a, a second active region 1390b, at least one first dummy active region 1390c, and a plurality of second dummy active regions 1390d. Each of the first and second transistors 1310, 1320 includes a plurality of fins 1330 (only one of the fins 1330 of each of the first and second transistors 1310, 1320 is shown in FIG. 13) and a plurality of gate stacks 1340. The fin 1330 of each of the first and second transistors 1310, 1320 extends from a respective one of the first and second active regions 1390a, 1390b. The gate stacks 1340 extend generally transverse to the fin 1330 and are arranged along the length of the fin 1330. The fin 1330 includes a plurality of source regions, a plurality of drain regions, and a plurality of channels, each of which is between a respective one of the source regions and a respective one of the drain regions and each of which is overlaid by a respective one of the gate stacks 1340.

The first semiconductor heat sink 1350a includes at least one dummy transistor disposed in the at least one first dummy active region 1390c, connected to the gate stacks 1340 of the first transistor 1310, and free from connection with the second transistor 1320. The second semiconductor heat sink 1350b includes a plurality of dummy transistors, each of which is disposed in a respective one of the second dummy active regions 1390d, connected to the gate stacks 1340 of the second transistor 1320, and free from connection with the first transistor 1310. In this exemplary embodiment, the number of the dummy transistors of the second semiconductor heat sink 1350b is greater than the number of the at least one dummy transistor of the first semiconductor heat sink 1350a. Also, in this exemplary embodiment, the dummy transistors are a FinFET. In another exemplary embodiment, the dummy transistors are a planar FET or a VGAA FET.

The semiconductor device 1300 further includes an isolation region (not shown), such as an STI region, that is disposed on the substrate 1390, that underlies the gate stacks of the dummy transistors and the gate stacks 1340, and that surrounds the fins of the dummy transistors and the fins 1330.

Figure 14:
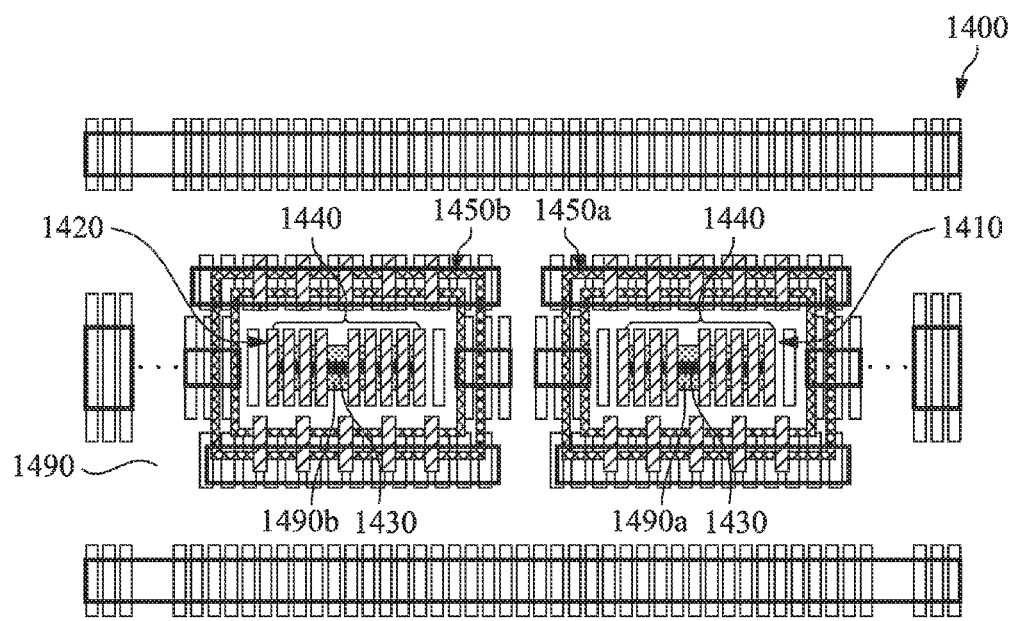
FIG. 14 is a schematic sectional top view of the thirteenth exemplary semiconductor device in accordance with some embodiments.

FIG. 14 is a schematic sectional top view of thirteenth exemplary semiconductor device in accordance with some embodiments. As illustrated in FIG. 14, the semiconductor device 1400 includes a substrate 1490, a first transistor 1410, a second transistor 1420, a first semiconductor heat sink 1450a, and a second semiconductor heat sink 1450b.

The substrate 1490 includes a first active region 1490a and a second active region 1490b. Each of the first and second transistors 1410, 1420 includes a plurality of fins 1430 (only one of the fins 1430 of each of the first and second transistors 1410, 1420 is shown in FIG. 14) and a plurality of gate stacks 1440. The fin 1430 of each of the first and second transistors 1410, 1420 extends from a respective one of the first and second active regions 1490a, 1490b. The gate stacks 1440 extend generally transverse to the fin 1430 and are arranged along the length of the fin 1430. The fin 1430 includes a plurality of source regions, a plurality of drain regions, and a plurality of channels, each of which is between a respective one of the source regions and a respective one of the drain regions and each of which is overlaid by a respective one of the gate stacks 1440.

The first semiconductor heat sink 1450a includes at least one dummy guard ring that is connected to the gate stacks 1440 of the first transistor 1410, that is free from connection with the second transistor 1420, and that includes a fin and a plurality of gate stacks. The fin of the at least one dummy guard ring extends from the substrate 1490 and is disposed around the first transistor 1410. The gate stacks of the at least one dummy guard ring are arranged along the length of the fin of the at least one dummy guard ring.

The second semiconductor heat sink 1450b includes a plurality of dummy guard rings that are connected to the gate stacks 1440 of the second transistor 1420, that are free from connection with the first transistor 1410, and that each include a fin and a plurality of gate stacks. The fin of each of the dummy guard rings extends from the substrate 1490 and is disposed around the second transistor 1420. The gate stacks of each of the dummy guard rings are arranged along the length of the fin of a respective one of the dummy guard rings. In this exemplary embodiment, the number of the dummy guard rings of the second semiconductor heat sink 1450b is greater than the number of the at least one dummy guard ring of the first semiconductor heat sink 1450a.

The semiconductor device 1400 further includes an isolation region (not shown), such as an STI region, that is disposed on the substrate 1490, that underlies the gate stacks of the at least one dummy guard ring, the gate stacks of the dummy guard rings, and the gate stacks 1440, and that surrounds the fin of the at least one dummy guard ring, the fins of the dummy guard rings, and the fins 1430.

Figure 15:
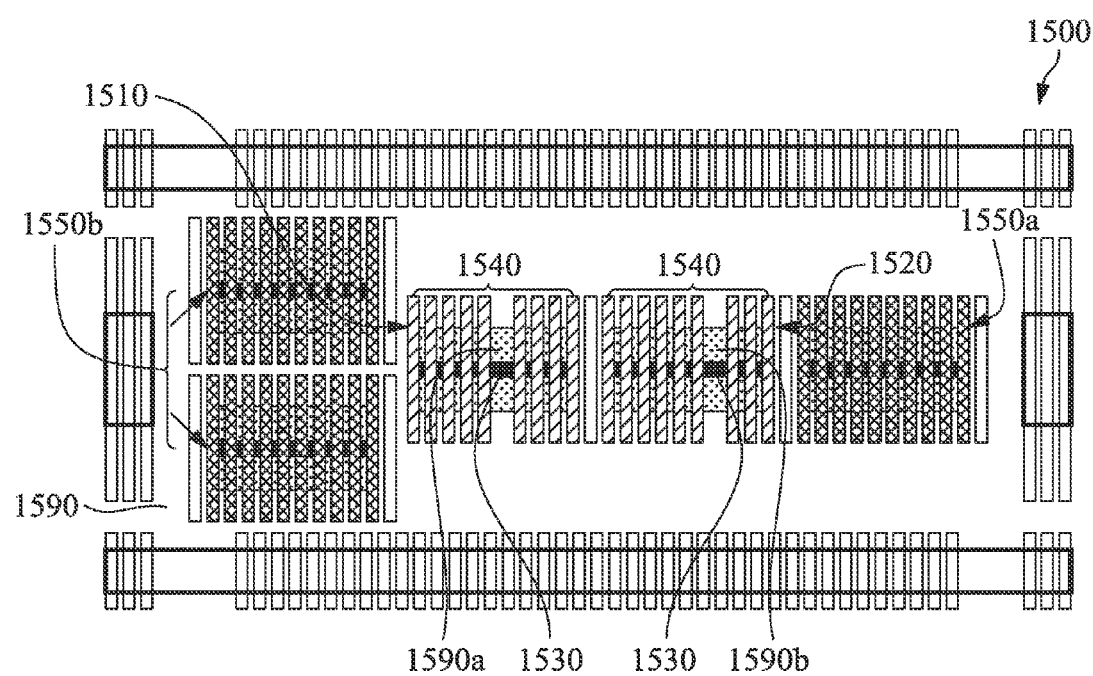
FIG. 15 is a schematic sectional top view of the fourteenth exemplary semiconductor device in accordance with some embodiments.

FIG. 15 is a schematic sectional top view of the fourteenth exemplary semiconductor device in accordance with some embodiments. As illustrated in FIG. 15, the semiconductor device 1500 includes a substrate 1590, a first transistor 1510, a second transistor 1520, at least one first semiconductor device 1550a, and a plurality of second semiconductor devices 1550b. In an exemplary embodiment, the semiconductor device 1500 is a 2.5- or 3-dimensional IC. In another exemplary embodiment, the semiconductor device 1500 is a stack CMOS.

In this exemplary embodiment, the first and second transistors 1510, 1520 are respectively disposed distal from and proximate to the at least one first semiconductor device 1550a and are further respectively disposed proximate to and distal from the second semiconductor devices 1550b. Each of the at least one first semiconductor device 1550a and the second semiconductor devices 1550b, in an exemplary embodiment, includes a plurality of transistors. In this exemplary embodiment, the number of the second semiconductor devices 1550b is greater than the number of the at least one first semiconductor device 1550a.

The substrate 1590 includes a first active region 1590a and a second active region 1590b. Each of the first and second transistors 1510, 1520 includes a plurality of fins 1530 (only one of the fins 1530 of each of the first and second transistors 1510, 1520 is shown in FIG. 15) and a plurality of gate stacks 1540. The fin 1530 of each of the first and second transistors 1510, 1520 extends from a respective one of the first and second active regions 1590a, 1590b. The gate stacks 1540 extend generally transverse to the fin 1530 and are arranged along the length of the fin 1530. The fin 1530 includes a plurality of source regions, a plurality of drain regions, and a plurality of channels, each of which is between a respective one of the source regions and a respective one of the drain regions and each of which is overlaid by a respective one of the gate stacks 1540.

The semiconductor device 1500 further includes an isolation region (not shown), such as an STI region, that is disposed on the substrate 1590, that underlies the gate stacks 1540, and that surrounds the fins 1530.

In the exemplary embodiments described above with reference to FIGS. 2 to 15, each of the first and second transistors is a FinFET. In an exemplary embodiment, the first transistor is an n-type FinFET and the second transistor is a p-type FinFET. In another exemplary embodiment, the first transistor is a p-type FinFET and the second transistor is an n-type FinFET. In another exemplary embodiment, at least one of the first and second transistors is a planar FET or a VGAA FET.

In addition, in the exemplary embodiments described above with reference to FIGS. 2 to 15, the substrate is a bulk substrate. Examples of materials for the substrate include, but are not limited to Si, Ge, SiGe, SiC, SiGeC, GaAs, GaN, another semiconductor material or alloy of semiconductor materials, and a combination thereof. In an alternative exemplary embodiment, the substrate is a semiconductor-on-insulator (SOI) substrate, and includes a first semiconductor layer overlying a dielectric layer, e.g., a buried oxide layer, and a second semiconductor layer underlying the dielectric layer.

Moreover, in the exemplary embodiments described above with reference to FIGS. 2 to 15, the first and second transistors are configured as an inverter of a ring VCO.

Further, in the exemplary embodiments described above with reference to FIGS. 2 to 15, the gate stack includes a first gate electrode, and a first gate dielectric sandwiched between the channel of the fin and the first gate electrode. The first gate dielectric includes a high-k dielectric material. Examples of high-k dielectric material include, but are not limited to, $HfO_2$, HFSiO, HFSiON, HfTaO, HfTiO, HfZrO, and the like. In an alternative exemplary embodiment, the gate stack further includes a second gate dielectric sandwiched between the channel of the fin and the first gate dielectric, and a second gate electrode sandwiched between the first gate dielectric and the first gate electrode. The second gate dielectric includes low-k dielectric material, such as $SiO_2$ or SiON. The first and second gate electrodes of the gate stacks includes Ti, Co, Al, Zr, La, Mg, TiN, TaC, another suitable metal material, or a combination thereof.

It has thus been shown that the semiconductor devices of the present disclosure include a first transistor configured to operate at a first temperature range, and a second transistor configured to operate at a second temperature range lower than the first temperature range. Those skilled in the art will readily appreciate that, after reading this disclosure, the structures of the semiconductor devices described herein may be combined to configure the first transistor to operate at a temperature range higher than the first temperature range and/or the second transistor to operate at a temperature range lower than the second temperature range.

In an embodiment of a semiconductor device for simultaneous operation at two temperature ranges, the semiconductor device comprises a substrate, a first transistor, and a second transistor. The substrate has a first active region and a second active region. The first transistor includes a plurality of gate stacks disposed in the first active region. The second transistor includes a plurality of gate stacks disposed in the second active region. A ratio of the number of the gate stacks of the second transistor to an area size of the second active region is less than a ratio of the number of the gate stacks of the first transistor to an area size of the first active region.

In another embodiment of a semiconductor device for simultaneous operation at two temperature ranges, the semiconductor device comprises a substrate, a first transistor, and a second transistor. The substrate has a first active region and a second active region. The second active region has an area size smaller than an area size of the first active region. The first transistor includes a plurality of gate stacks disposed in the first active region. The second transistor includes a plurality of gate stacks disposed in the second active region. The number of the gate stacks of the second transistor is less than the number of the gate stacks of the first transistor.

In another embodiment of a semiconductor device for simultaneous operation at two temperature ranges, the semiconductor device comprises a first transistor, i heat sinks connected to the first transistor, a second transistor, and j heat sinks connected to the second transistor, where i>j and j≥0.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device for simultaneous operation at two temperature ranges, the semiconductor device comprising:
   a substrate having a first active region and a second active region;
   a first transistor including a plurality of gate stacks disposed in the first active region; and
   a second transistor including a plurality of gate stacks disposed in the second active region, wherein a ratio of the number of the gate stacks of the second transistor to an area size of the second active region is less than a ratio of the number of the gate stacks of the first transistor to an area size of the first active region;
   wherein the number of the gate stacks of the second transistor is less than the number of the gate stacks of the first transistor.

2. The semiconductor device of claim 1, wherein the gate stacks of the second transistor have a pitch substantially equal to a pitch of the gate stacks of the first transistor.

3. The semiconductor device of claim 1, wherein the gate stacks of the second transistor have a pitch greater than a pitch of the gate stacks of the first transistor.

4. The semiconductor device of claim 1, wherein the area size of the second active region is larger than the area size of the first active region.

5. The semiconductor device of claim 1, wherein the first and second transistors have different conductivity types.

6. The semiconductor device of claim 5, wherein the number of first semiconductor devices disposed proximate to the first transistor and distal from the second transistor is greater than the number of second semiconductor devices disposed proximate to the second transistor and distal from the first transistor.

7. The semiconductor device of claim 1, wherein at least one of the first and second transistors is one of a fin field-effect transistor (FinFET), a vertical gate-all-around FET (VGAA FET), and a planar FET.

8. The semiconductor device of claim 1, wherein the number of the gate stacks of the second transistor is equal to the number of the gate stacks of the first transistor.

9. The semiconductor device of claim 1, wherein i heat sinks are disposed above the first transistor, and j heat sinks are disposed above the second transistor, and i>j and j≥0.

10. The semiconductor device of claim 1, further comprising:
a third active region of the substrate that is adjacent the first active region; and
a fourth active region of the substrate that is adjacent the fourth active region;
wherein a distance between the first and third active regions is greater than a distance between the second and fourth active regions.

11. A semiconductor device for simultaneous operation at two temperature ranges, the semiconductor device comprising:
a substrate having a first active region and a second active region, wherein the second active region has an area size greater than an area size of the first active region;
a first transistor including a plurality of gate stacks disposed in the first active region; and
a second transistor including a plurality of gate stacks disposed in the second active region, wherein the number of the gate stacks of the second transistor is less than the number of the gate stacks of the first transistor.

12. The semiconductor device of claim 11, wherein the gate stacks of the second transistor have a pitch substantially equal to a pitch of the gate stacks of the first transistor.

13. The semiconductor device of claim 11, wherein the gate stacks of the second transistor have a pitch greater than a pitch of the gate stacks of the first transistor.

14. The semiconductor device of claim 11, wherein the first and second transistors have different conductivity types.

15. The semiconductor device of claim 14, wherein the number of first semiconductor devices disposed proximate to the first transistor and distal from the second transistor is greater than the number of second semiconductor devices disposed proximate to the second transistor and distal from the first transistor.

16. The semiconductor device of claim 15, wherein the first and second transistors have different conductivity types.

17. The semiconductor device of claim 15, wherein at least one of the first and second transistors is one of a FinFET, a VGAA FET, and a planar FET.

18. The semiconductor device of claim 11, wherein at least one of the first and second transistors is one of a FinFET, a VGAA FET, and a planar FET.

19. The semiconductor device of claim 11, wherein i heat sinks are disposed above the first transistor, and j heat sinks are disposed above the second transistor, and i>j and j≥0.

20. The semiconductor device of claim 11, further comprising:
a third active region of the substrate that is adjacent the first active region; and
a fourth active region of the substrate that is adjacent the fourth active region;
wherein a distance between the first and third active regions is greater than a distance between the second and fourth active regions.

* * * * *